United States Patent [19]

Nakajima et al.

[11] Patent Number: 6,043,522
[45] Date of Patent: Mar. 28, 2000

[54] FIELD EFFECT TRANSISTOR ARRAY INCLUDING DOPED TWO-CELL ISOLATION REGION FOR PREVENTING LATCHUP

[75] Inventors: Michio Nakajima; Makoto Hatakenaka; Akira Kitaguchi, all of Tokyo; Kiyoyuki Shiroshima, Hyogo; Takekazu Yamashita; Masaaki Matsuo, both of Nagasaki, all of Japan

[73] Assignees: Mitsubishi Electric System LSI Design Corporation, Hyogo; Mitsubishi Denki Kabushiki Kaisha, Tokyo, both of Japan

[21] Appl. No.: 09/061,090

[22] Filed: Apr. 16, 1998

[30] Foreign Application Priority Data

Oct. 6, 1997 [JP] Japan .................................. 9-273074

[51] Int. Cl.$^7$ .................................................. H01L 27/10
[52] U.S. Cl. ......................... 257/206; 257/202; 257/204; 257/371; 257/372; 257/373; 257/901; 257/909
[58] Field of Search .................................... 257/372, 549, 257/546, 550, 563, 901, 909, 205, 206, 202, 204, 371, 373

[56] References Cited

U.S. PATENT DOCUMENTS 3,648,130  3/1972  Castrucci et al. ....................... 257/549
4,661,815  4/1987  Takayama et al. ..................... 257/204
5,723,875  3/1998  Abe et al. ................................. 257/48

FOREIGN PATENT DOCUMENTS 61-147564   7/1986  Japan .
3239359   10/1991  Japan .
697374    4/1994  Japan .
846054    2/1996  Japan .

Primary Examiner—Jerome Jackson, Jr.
Assistant Examiner—Bradley William Baumeister
Attorney, Agent, or Firm—Leydig, Voit & Mayer, Ltd.

[57] ABSTRACT

A semiconductor device capable of solving a problem of a conventional semiconductor device in that a high density integration cannot be expected because each cell, which includes a pair of N and P wells disposed adjacently, requires a countermeasure against latchup individually. The high density integration prevents an effective countermeasure against latchup. The present semiconductor device arranges two cells, which are adjacent in the direction of an alignment of the N wells and P wells, in opposite directions so that two P wells (or two N wells) of the two adjacent cells are disposed successively, and includes an isolation layer extending across the two adjacent cells to enclose the two successively disposed P wells, thereby isolating the two P wells collectively from the substrate.

4 Claims, 10 Drawing Sheets

Vcc>GND>VBB

Vcc>GND>VBB

FIELD EFFECT TRANSISTOR ARRAY INCLUDING DOPED TWO-CELL ISOLATION REGION FOR PREVENTING LATCHUP

BACKGROUND OF THE INVENTION

1. Field of the Invention

The present invention relates to a semiconductor device and particularly to an improvement applied in fabricating a semiconductor device with a structure in which a memory circuit, like a dynamic random access memory (DRAM), and a logic circuit are present in the same substrate.

2. Description of Related Art

FIG. 7 is a plan view showing a cell structure of a conventional semiconductor device. In FIG. 7, the reference numeral 1 designates a substrate doped P-type (P conductivity type); 2 designates an N$^+$-type diffused region for a drain in one region of the substrate 1; 3 designates an N-type well adjacent to the N$^+$-type diffused region 2 in the substrate 1; 4 designates a P$^+$-type diffused region for a source located in the N-type well 3; and 5 designates an N$^+$-type diffused region for a source located in the N-type well 3, between the P$^+$-type diffused region 4 and the N$^+$-type diffused region 2.

The reference numeral 6 designates a high potential power line on and separated from the substrate 1 by an insulating layer and connected to the P$^+$-type diffused region 4 and the N$^+$-type diffused region 5; 7 designates a low potential power line on and separated from the substrate 1 by an insulating layer and connected to the N$^+$-type diffused region 2; 8 designates an output signal line connected to the P$^+$-type diffused region 4 and N$^+$-type diffused region 2; and 9 designates an input signal line on the P$^+$-type diffused region 4, located between the high potential power line 6 and the output signal line 8, as well as on the N$^+$-type diffused region 2, between the low potential power line 7 and the output signal line 8. The substrate 1 is supplied with a potential $V_{BB}$ that is lower than the GND potential.

FIG. 8 is a plan view showing a layout of a semiconductor device including a plurality of the cells of FIG. 7. In FIG. 8, each of reference numerals 10 designates a cell as shown in FIG. 1; and each of reference numerals 16 designates a set of signal lines for transferring signals to and from the cells. The cells 10 are arranged in the same direction as indicated by the N-type well 3 disposed at the same side of each cell 10, considering design efficiency, with an auto-router or the like.

Assuming that the high potential power line 6 is connected to a Vcc potential and the low potential power line 7 is connected to the GND (ground). When a signal at the GND level is input through the input signal line 9, the N$^+$-type diffused region 2 is controlled to be in a cutoff state, whereas the P$^+$-type diffused region 4 is controlled to be in a linear operating state. As a result, a signal at the Vcc level is produced at the output signal line 8.

In contrast, when a signal at the Vcc level is input through the input signal line 9, the P$^+$-type diffused region 4 is controlled to be in the cutoff state, whereas the N$^+$-type diffused region 2 is controlled to be in a linear operating state. As a result, a signal at the GND level is produced at the output signal line 8.

Thus, the cell operates as an inverter. With such an arrangement, the conventional semiconductor device has a problem called latchup due to a thyristor structure formed in each cell.

FIG. 9A is a cross-sectional view taken along the line 9A—9A of the semiconductor device cell as shown in FIG. 7. In FIG. 9A, the reference symbol Tr1 designates a first bipolar transistor formed between the N-type well 3 and the substrate 1 with the P$^+$-type diffused region 4 as its emitter; R1 designates a first resistor composed of the N-type well 3; Tr2 designates a second bipolar transistor formed between the substrate 1 and the N-type well 3 with the N$^+$-type diffused region 2 as its emitter; and R2 designates a second resistor including part of the substrate 1. FIG. 9B shows a circuit structure equivalent to the bipolar transistors shown in FIG. 9A.

If a current flows through the first resistor R1 due to some cause, the first bipolar transistor Tr1 will turn on, owing to a voltage across the first resistor R1, which, in turn, brings about a voltage across the second resistor R2 due to the current passing between the emitter and collector of the first bipolar transistor Tr1. As a result, the base-emitter voltage of the second bipolar transistor Tr2 increases, owing to the voltage across the second resistor R2, which increases the current flowing through the first resistor R1. Accordingly, once such an operation has been started with the product of the amplification factor of the first bipolar transistor Tr1 and that of the second bipolar transistor Tr2 exceeding unity, the currents flowing through the bipolar transistors Tr1 and Tr2 continue to increase, leading to substrate breakdown in extreme cases. This operation is called latchup.

To avoid latchup, the semiconductor device shown in FIG. 9A has, in the N-type well 3, the N$^+$-type diffused source region 5 between the P$^+$-type diffused source region 4 and the N$^+$-type diffused drain region 2. This N-type well 3 reduces the resistance of the first resistor R1 including the N-type well 3, which hinders the turning on of the first bipolar transistor Tr1.

Such a structure, however, cannot prevent latchup when the second bipolar transistor Tr2 conducts, owing to fluctuations of its base potential, due to the voltage across the second resistor R2. In particular, latchup can occur frequently in a semiconductor device comprising in the same substrate a logic circuit and a memory circuit, such as a dynamic random access memory (DRAM), because of the fluctuation of the substrate potential $V_{BB}$ due to the current flowing from the logic circuit to the substrate 1.

To prevent conduction by the second bipolar transistor Tr2 in the semiconductor device as shown in FIG. 9A, it will be possible, instead of reducing the resistance of the second resistor R2, which is very difficult, to widen the space A between the N-type well 3 and the N$^+$-type diffused region 2, thereby increasing the base-emitter (VBE) voltage required for the second bipolar transistor Tr2 to turn on. This widening, however, increases the total width W1 of the cell, which hinders fabricating a high density semiconductor device.

In view of this difficulty, it may be possible to take steps against latchup using one of the techniques disclosed in Japanese Published Patent Applications Sho. 61-147564, Hei. 3-239359, Hei. 8-46054, and Hei. 6-97374.

FIG. 10 is a cross-sectional view showing a structure of a conventional semiconductor device including a countermeasure against latchup. In FIG. 10, the reference numeral 13 designates an N-type (N conductivity type) buried diffused region disposed under the N$^+$-type diffused region 2; 12 designates an N-type diffused region for isolation, enclosing the N$^+$-type diffused region 2, between the surface of the substrate 1 and the N-type buried diffused region 13; and 11 designates a P-type well isolated from the substrate 1 by the $N^+$-type diffused region 2 and the $N^+$-type diffused region 12. Since the remaining structure is the same as that of the conventional semiconductor device shown in FIG. 7, its description is omitted. The N-type buried diffused region 13 and the N-type diffused region 12 are referred to as an isolation region hereinafter.

The semiconductor device with such a structure can thoroughly solve the latchup problem because the collector of the second bipolar transistor Tr2 is disconnected from the base of the first bipolar transistor Tr1 and the base of the second bipolar transistor Tr2 is disconnected from the collector of the first bipolar transistor Tr1 as shown in FIG. 10. Hence, the thyristor structure shown in FIG. 9B is not present in each cell.

The semiconductor device with such a structure must, however, have the isolation regions 12 and 13 in each cell. These regions result in an increase in the total width W2 of the cell, which hinders high density integration.

SUMMARY OF THE INVENTION

The present invention is implemented to solve the foregoing problem. It is therefore an object of the present invention to provide a semiconductor device capable of achieving high density integration and preventing latchup.

According to a first aspect of the present invention, there is provided a semiconductor device comprising a substrate doped P-type or N-type, including two or more cells, each of the cells including an N-type well and a P-type well; a P-type diffused region in the N-type well; an N-type diffused region in the P-type well; and an isolation region isolating the one of the N-type well and the P-type well having the same conductivity type as the substrate, from the substrate, wherein any two cells which are adjacent in a direction of alignment of both N-type and P-type wells are arranged so that the two wells of the same conductivity type are in an isolation region isolating the cells collectively from the substrate, the two successive wells having the same conductivity type as the substrate.

The substrate may be P-type and set at a potential equal to or lower than a ground potential. The substrate may be N-type and set at a potential equal to or higher than a high potential of a power supply.

According to a second aspect of the present invention, there is provided a semiconductor device comprising a substrate doped P-type or N-type and having a potential set equal to or less than a ground potential; and a plurality of memory cells and logic cells, each of the logic cells including an N-type well in the substrate; a P-type well in the substrate; a P-type diffused region in the N-type well; an N-type diffused region located in the P-type well; and an isolation region isolating the one of the P-type and N-type well having the same conductivity type as the substrate from the substrate, wherein any two logic cells which are adjacent in a direction of an alignment of both N-type wells and P-type wells are arranged so that two wells of the same conductivity type are disposed successively in the two adjacent logic cells, and wherein the isolation layer extends across the two adjacent logic cells to enclose the two successive wells of the same conductivity type to isolate them collectively from the substrate, the two successive wells having the same conductivity type as the substrate.

According to a third aspect of the present invention, there is provided a semiconductor device comprising a substrate doped P-type or N-type, and whose potential is set equal to or higher than a high potential; and a plurality of memory cells and logic cells, each of the logic cells including an N-type well in the substrate; a P-type well in the substrate; a P-type diffused region in the N-type well; an N-type diffused region in the P-type well; and an isolation region isolating the one of the N-type well and the P-type well having the same conductivity type as the substrate, from the substrate, wherein any two logic cells which are adjacent in a direction of alignment of both the N-type and the P-type wells are arranged so that two wells of the same conductivity type are disposed successively in the two adjacent logic cells, and wherein the isolation regions extends across the two adjacent logic cells to isolate the two successive wells of the same conductivity type collectively from the substrate, the two successive wells having the same conductivity type as the substrate.

According to the present invention, it is possible to disconnect a bipolar transistor formed in the N-type well from a bipolar transistor formed in the P-type well and hence to prevent a thyristor structure from being created, thereby avoiding latchup.

Furthermore, since a semiconductor device in accordance with the present invention includes an isolation region for every other cell, it suppresses an increase of the cell width due to the isolation region, thereby achieving a high degree of integration while avoiding latchup.

A semiconductor device in accordance with the present invention is preferably applied, for example, to a device that includes a DRAM and a logic circuit on the same substrate, in which case a P-type substrate can be set at a potential equal to or less than the ground potential or an N-type substrate can be set at a potential equal to or higher than the high potential of a power supply. The setting of the potential at a potential other than the high potential of the power supply or the ground potential and the potential that must be generated in the semiconductor device itself, often present, in conventional devices, potential fluctuations due to rather large currents flowing from the logic circuit to the substrate. The cell structure in accordance with the present invention can prevent a large current from flowing into the substrate, which enables a DRAM and a logic circuit to be present on the same substrate.

Viewing this from a different angle, a cell structure in accordance with the present invention is particularly useful for logic cells of a semiconductor device which includes multiple memory cells and logic cells and in which the potential of the substrate is set at a potential lower than the ground potential or higher than the high potential of the power supply.

BRIEF DESCRIPTION OF THE INVENTION

DETAILED DESCRIPTION OF THE PREFERRED EMBODIMENTS

The invention will now be described with reference to the accompanying drawings.

Embodiment 1

Figure 1A:
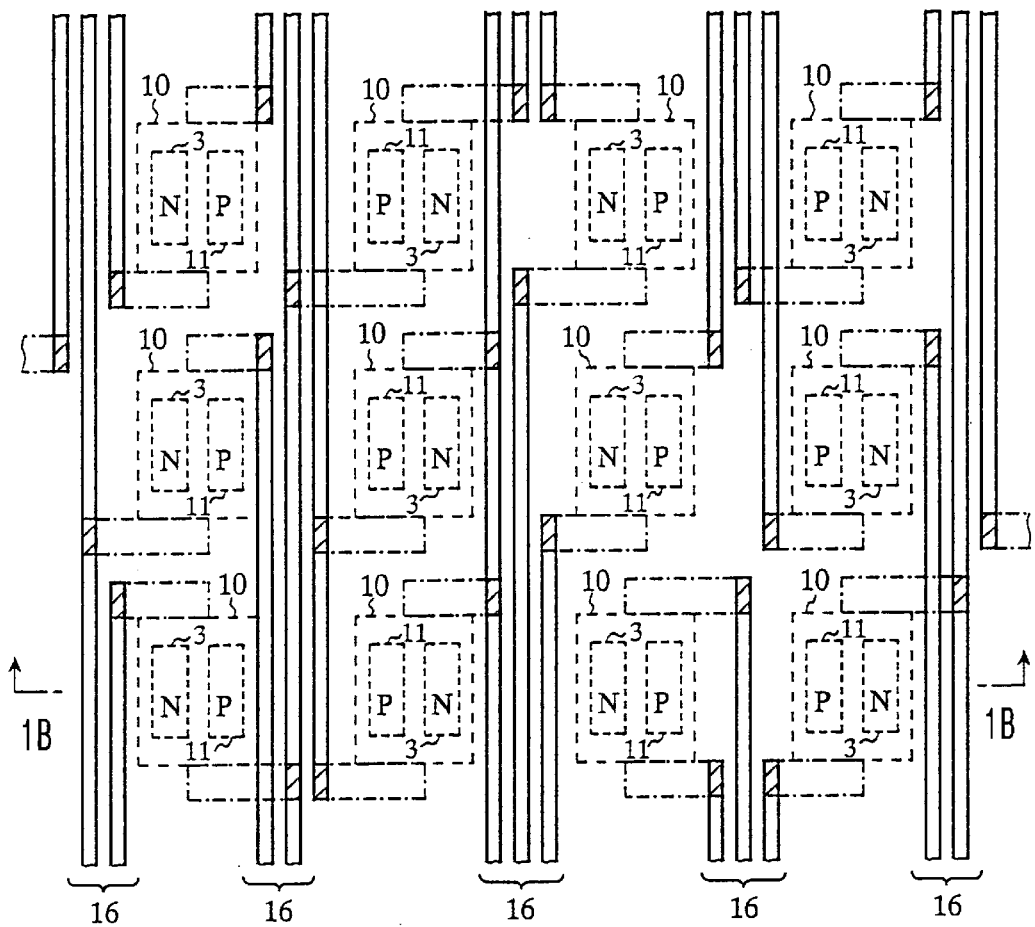
FIGS. 1A and 1B are plan and cross-sectional views, respectively, showing a layout of an embodiment 1 of a semiconductor device in accordance with the present invention.
Figure 1B:
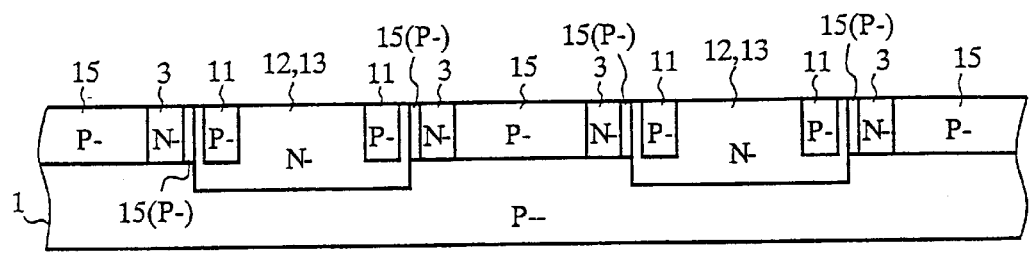

FIGS. 1A and 1B are a plan view and a cross-sectional view, respectively, showing a layout of an embodiment 1 of a semiconductor device in accordance with the present invention. The semiconductor device comprises a DRAM and a logic circuit including field effect transistors and disposed on the same substrate, and FIGS. 1A and 1B show cells of the logic circuit. In FIG. 1A, each of reference numerals 10 designates a cell, with the cells arranged in a matrix on the semiconductor substrate; and each of the reference numerals 16 designates signal lines disposed between the cells on the semiconductor substrate for transferring signals to and from the cells. Each of reference numerals 3 designates N-type wells in each of the cells 10; and each of reference numerals 11 designates P-type wells, adjacent to an N-type well 3, in each of the cells 10. As clearly seen from FIG. 1A, the wells 3 and 11 in the cells 10 are arranged in opposite directions in any two adjacent columns of the cells 10. In alternate columns of the cells 10, two columns of the N-type wells 3 or two columns of the P-type wells 11 are disposed adjacent to each other.

Figure 2:
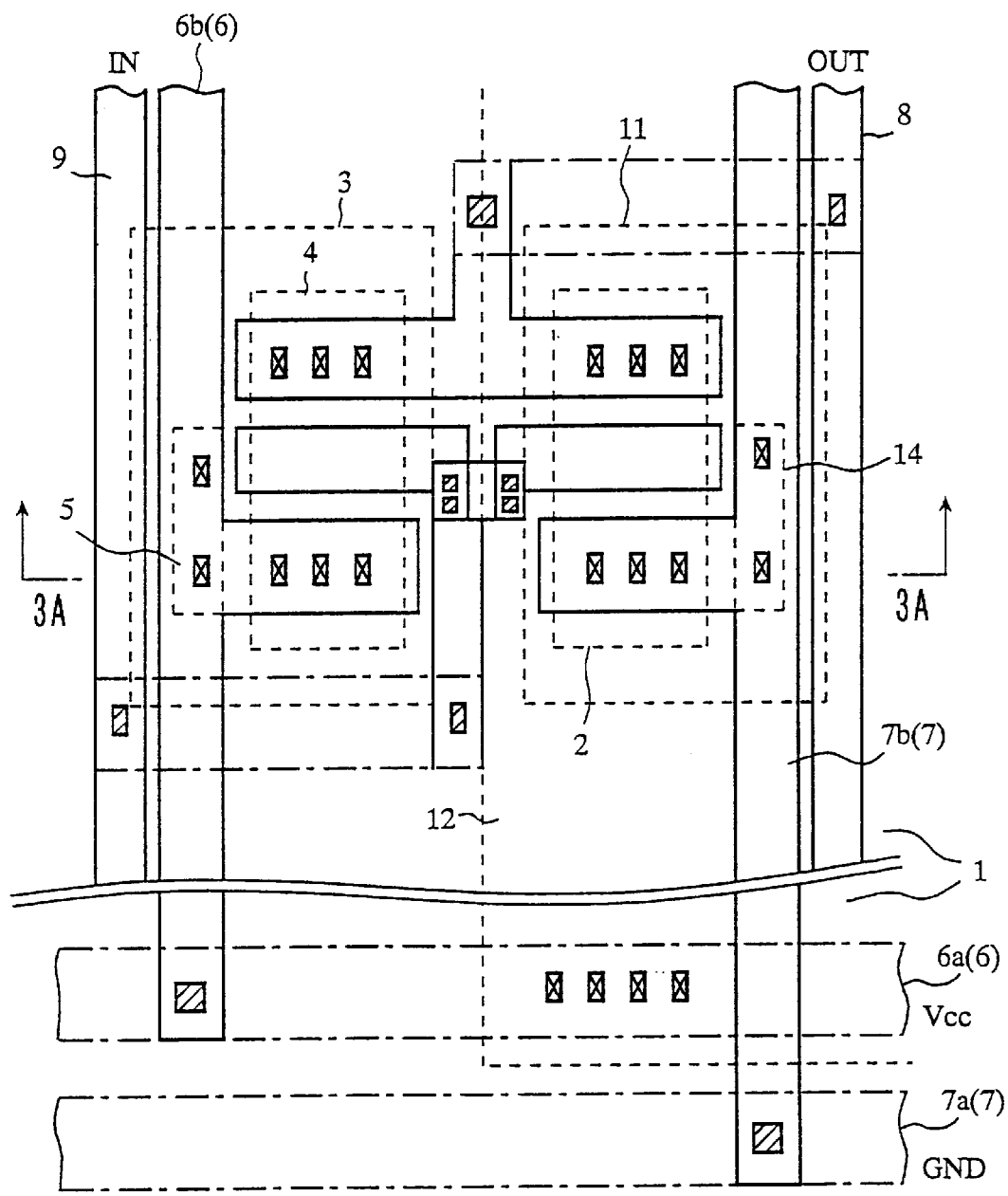
FIG. 2 is a plan view showing a cell of embodiment 1 of the semiconductor device.
Figures 3A, 3B:
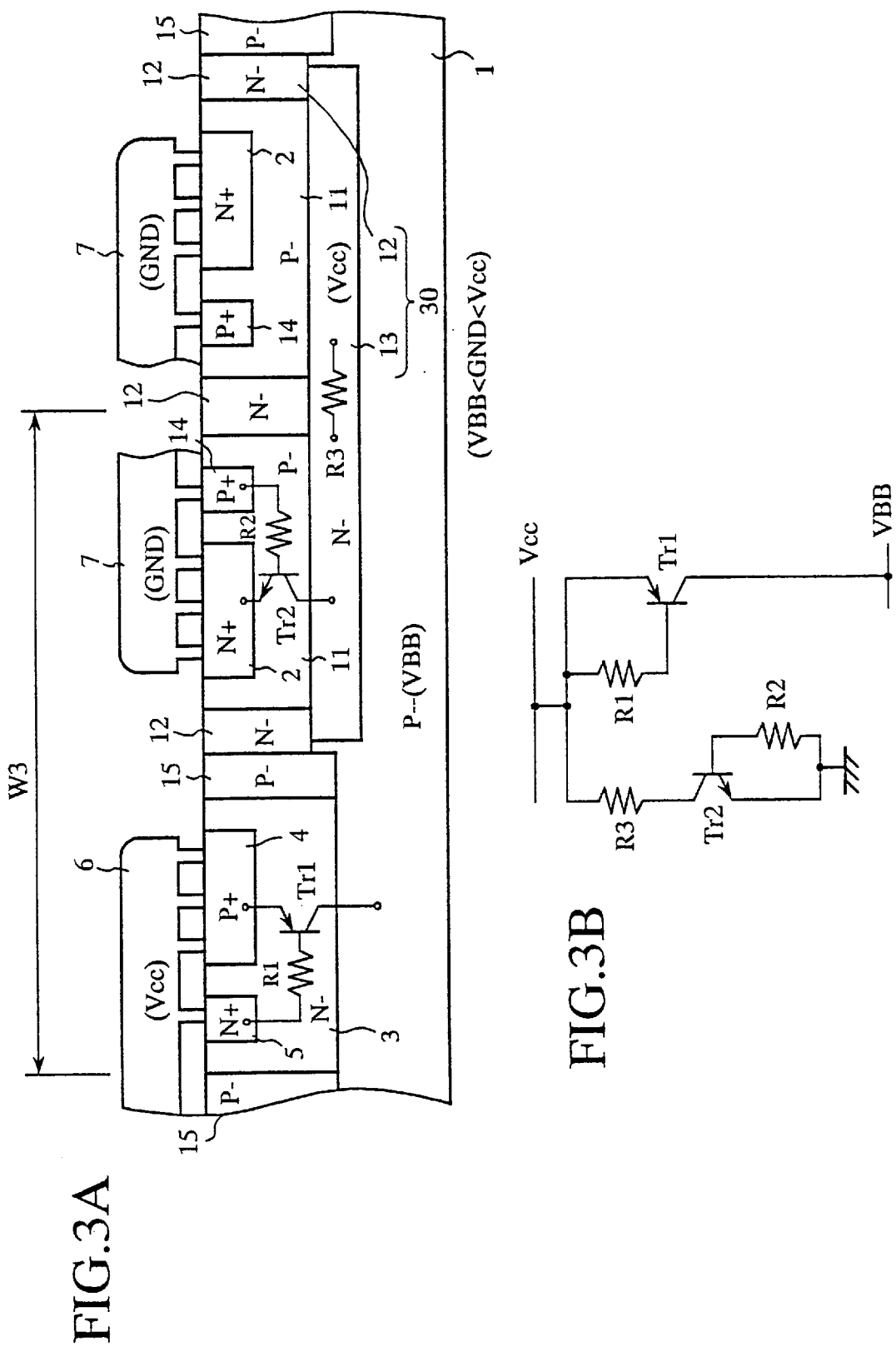
FIGS. 3A and 3B are a cross-sectional view showing the cell and a circuit diagram showing a transistor structure, respectively, of embodiment 1 of the semiconductor device.

FIG. 2 is a plan view showing one of the cells, and FIG. 3A is a cross-sectional view taken along the line 3A—3A of FIG. 2, showing the cell and its neighborhood.

In these figures, the reference numeral 1 designates a P-type substrate; 11 designates a P-type well at a surface of the substrate 1; 3 designates an N-type well adjacent to the P-type well 11 in the substrate 1; 9 designates an input signal line for supplying a signal to the cell 10 from a position next to the N-type well 3; and 8 designates an output signal line for outputting, from a position next to the P-type well 11, the output signal of the cell 10.

Reference numeral 4 designates a P$^+$-type diffused region for a source (P-type diffused region) at a location in the N-type well 3 next to the P-type well 11; 5 designates an N$^+$-type diffused region for a source at a location in the N-type well 3 between the P$^+$-type diffused region 4 and the input signal line 9; 2 designates an N$^+$-type diffused region for a drain (N-type diffused region) at a location in the P-type well 11 next to the N-type well 3; and 14 designates a P$^+$-type diffused region for a drain at a location in the P-type well 11 between the N$^+$-type diffused region 2 and the output signal line 8.

Reference numeral 13 designates an N-type buried diffused region disposed under two N$^+$-type diffused regions 2, extending across two adjacent cells 10; 12 designates an N-type diffused region 12 for isolation disposed between the surface of the substrate 1 and the N-type buried diffused region 13, enclosing each N$^+$-type diffused region 2; and 15 designates a P-type diffused region for isolating the N-type well 3 from its adjacent N-type well 3 or N-type diffused region 12 (see also FIG. 1B).

Reference numeral 6 designates a high potential power line that includes a main power line 6a disposed perpendicular to the signal lines 16 shown in FIG. 1A and a cell supply line 6b crossing the N$^+$-type diffused region 5 and is connected to the N$^+$-type diffused region 5 and P$^+$-type diffused region 4; and 7 designates a low potential power line that includes a main power line 7a disposed perpendicular to the signal lines 16 shown in FIG. 1A, and a cell supply line 7b crossing the P$^+$-type diffused region 14, and is connected to the P$^+$-type diffused region 14 and N$^+$-type diffused region 2. Besides, the main power line 6a is connected to the N-type diffused region 12 so that the high voltage is supplied to the isolation region 30 consisting of the N-type diffused region 12 and the N-type buried diffused region 13.

With such an arrangement, a bipolar transistor structure is formed as shown in FIG. 3A. It is assumed in FIG. 3A that a Vcc potential, higher than the GND potential, is applied to the high potential power line 6; the GND potential is applied to the low potential power line 7; a $V_{BB}$ potential, lower than the GND potential, is applied to the P-type substrate 1; and the Vcc potential is supplied to the N-type buried diffused region 13. In FIG. 3A, Tr1 designates a first bipolar transistor formed between the N-type well 3 and the P-type substrate 1 with the P$^+$-type diffused region 4 as its emitter; R1 designates a first resistor including the N-type well 3; Tr2 designates a second bipolar transistor formed between the P-type substrate 1 and the N-type well 3 with the N$^+$-type diffused region 2 as its emitter; R2 designates a second resistor including the P-type substrate 1; and R3 designates a third resistor including the N-type buried diffused region 13.

FIG. 3B is a circuit diagram illustrating an equivalent circuit of the transistor structure shown in FIG. 3A. As shown in FIG. 3B, since the transistor structure of each cell 10 of embodiment 1 has the collector of the second bipolar transistor Tr2 not directly connected to the base of the first bipolar transistor Tr1, and the base of the second bipolar transistor Tr2 disconnected from the collector of the first bipolar transistor Tr1, no thyristor structure is formed. Thus, the latchup problem is completely solved.

When a signal at the GND level is input through the input signal line 9, the N$^+$-type diffused region 2 is controlled to be in a cutoff state, whereas the P$^+$-type diffused region 4 is controlled to be in a linear operating state. As a result, a signal at the Vcc level is produced from the output signal line 8.

In contrast, when a signal at the Vcc level is input through the input signal line 9, the P$^+$-type diffused region 4 is controlled to be in the cutoff state, whereas the N$^+$-type diffused region 2 is controlled to be in the linear operating state. As a result, a signal at the GND level is produced from the output signal line 8.

Accordingly, the foregoing cell 10 operates as an inverter. Combining the multiple cells 10 makes it possible to implement various types of logic circuits.

Thus, the present embodiment 1 can prevent the thyristor structure from occurring because the first bipolar transistor Tr1 formed in the N-type well 3 is isolated from the second bipolar transistor Tr2 formed in the P-type well 11 thanks to the following structure. First, any two cells 10 which are adjacent along the direction of alignment of the P-type wells 11 and the N-type wells 3 are arranged so that either two N-type wells 3 or two P-type wells 11 are arranged successively in the two adjacent cells 10. Second, the isolation region 30, consisting of the N-type diffused region 12 and N-type buried diffused region 13, extends across the two adjacent cells in which two P-type wells 11 to be isolated from the substrate 1 are adjacent, so that the two successive P-type wells 11 in the two adjacent cells are isolated collectively from the substrate 1.

As a result, embodiment 1 prevents a large current from flowing into the substrate 1 from the logic circuit even if the semiconductor device includes a DRAM and a logic circuit on the same substrate 1 and generates the voltage applied to the substrate 1 within itself, in spite of its small current capacity, as in the case where the P-type substrate is set at a potential lower than the ground potential. This arrangement offers the advantage of avoiding latchup. In other words, the cells 10 for the logic circuit with the foregoing structure prevent latchup even in a semiconductor device in which a DRAM and a logic circuit are present together, and the potential of the substrate 1 is set lower than the ground potential.

In addition, since the isolation region 30 is present in every other pair of adjacent cells in the structure, the increase in the total cell width W3 due to the isolation region 30 is limited. This structure enables a high degree of integration while avoiding latchup.

Embodiment 2

Figure 4A:
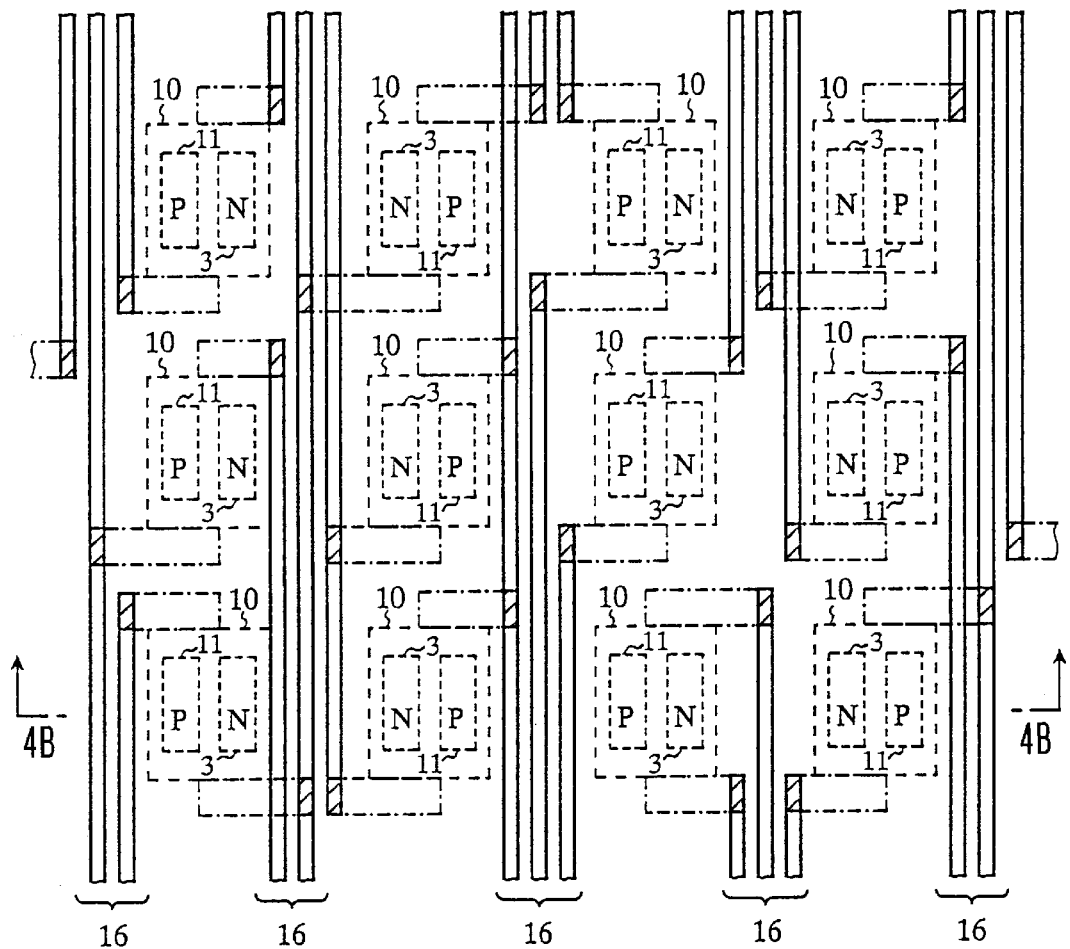
FIGS. 4A and 4B are plan and cross-sectional views, respectively, showing a layout of an embodiment 2 of a semiconductor device in accordance with the present invention.
Figure 4B:
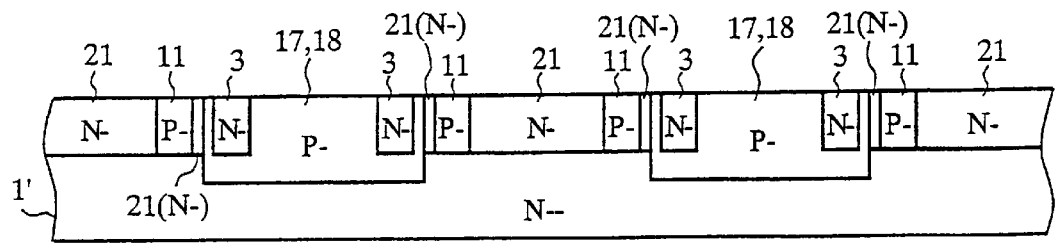

FIGS. 4A and 4B are a plan view and cross-sectional view, respectively, showing a layout of an embodiment 2 of a semiconductor device in accordance with the present invention. The semiconductor device comprises a DRAM and a logic circuit disposed on the same substrate, and FIGS. 4A and 4B show cells of the logic circuit. In these figures, each of reference numerals 10 designates a cell with the cells arranged in a matrix on the semiconductor substrate 1; and each of reference numerals 16 designates signal lines disposed between the cells on the semiconductor substrate for transferring signals to and from the cells. Each of reference numerals 3 designates an N-type well in each cell 10; and each of reference numerals 11 designates a P-type well adjacent to the N-type well 3 in a cell 10. As clearly seen from FIG. 4A, the cells 10 are arranged so that in any two adjacent columns of the cells 10, either two columns of the N-type wells 3 or two columns of the P-type wells 11, are disposed adjacent to each other.

Figure 5:
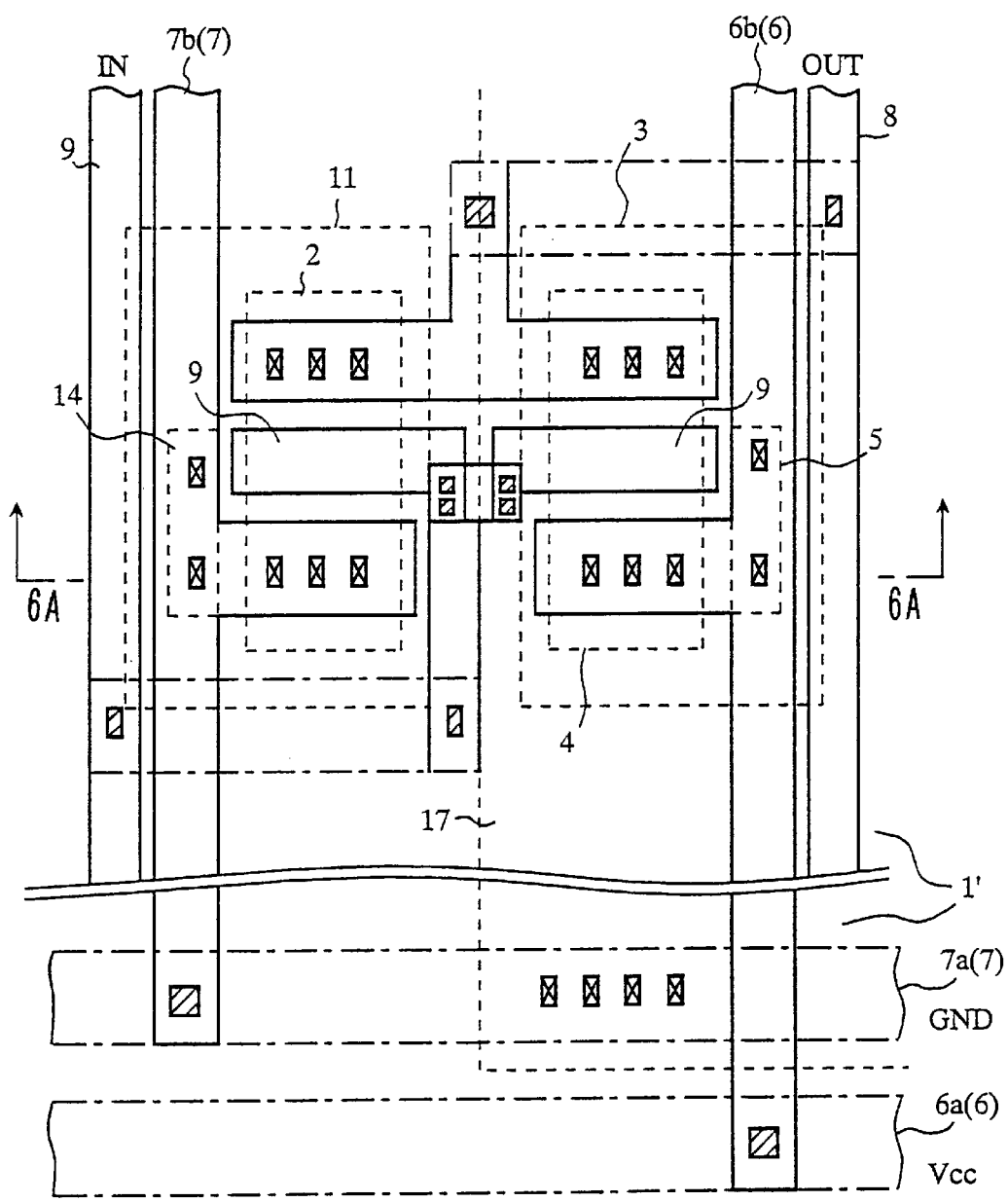
FIG. 5 is a plan view showing a cell of embodiment 2 of the semiconductor device.
Figure 6A:
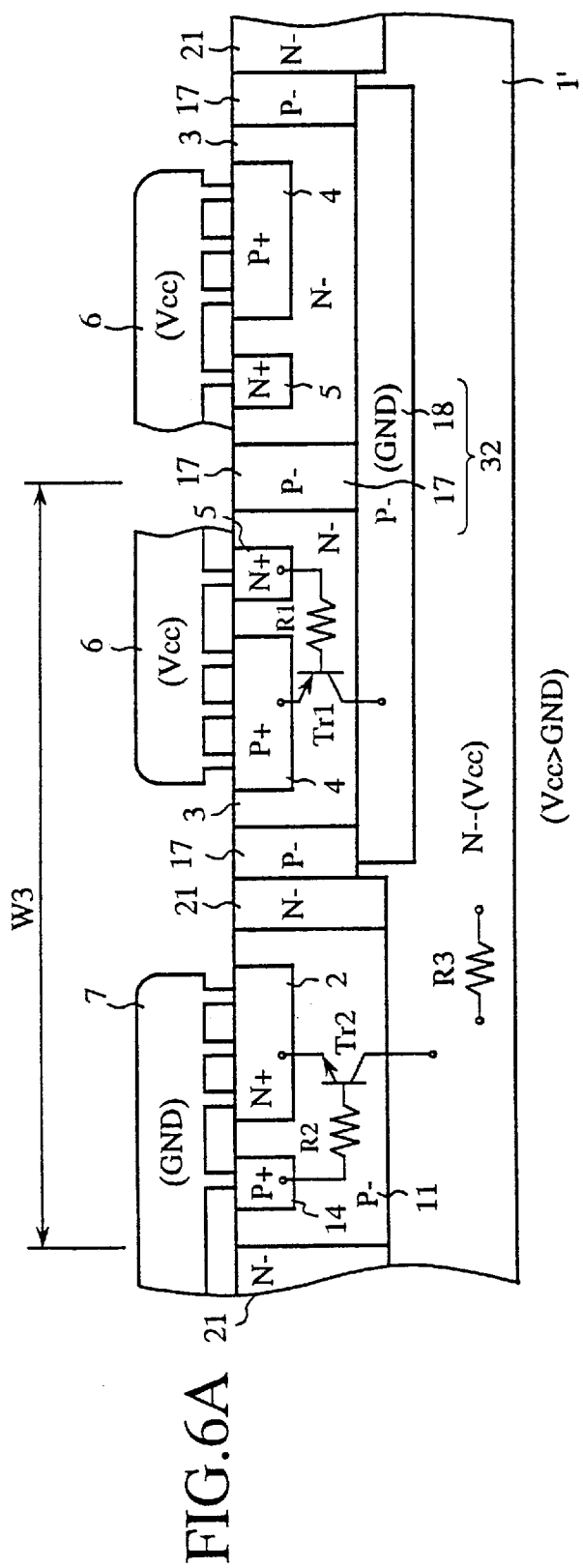
FIGS. 6A and 6B are a cross-sectional view showing the cell and a circuit diagram showing a transistor structure, respectively, of embodiment 2 of the semiconductor device.

FIG. 5 is a plan view showing one of the cells, and FIG. 6A is a cross-sectional view taken along the line 6A—6A of FIG. 5 showing the cell and its neighborhood.

In these figures, the reference numeral 1' designates an N-type substrate; 11 designates a P-type well at a surface of the N-type substrate 1'; 3 designates an N-type well adjacent to the P-type well 11 in the N-type substrate 1'; 9 designates an input signal line for supplying a signal to the cell 10 from a position next to the P-type well 11; and 8 designates an output signal line for outputting from a position next to the N-type well 3 the output signal of the cell 10. The reference numeral 4 designates a P$^+$-type diffused region for a source at a location in the N-type well 3 next to the P-type well 11; 5 designates an N$^+$-type diffused region for a source at a location in the N-type well 3 between the P$^+$-type diffused region 4 and output signal line 8; 2 designates an N$^+$-type diffused region for a drain at a location in the P-type well 11 next to the N-type well 3; and 14 designates a P$^+$-type diffused region for a drain at a location in the P-type well 11 between the N$^+$-type diffused region 2 and the input signal line 9.

The reference numeral 18 designates a P-type buried diffused region disposed under two N-type wells 3 extending across two adjacent cells 10; 17 designates a P-type diffused region for isolation disposed between the surface of the N-type substrate 1' and the P-type buried diffused region 18 enclosing each N-type well 3; and 21 designates an N-type diffused region for isolating the P-type well 11 from its adjacent P-type well 11 or P-type diffused region 17 (see also FIG. 4B).

The reference numeral 6 designates a high potential power line that includes a main power line 6a disposed perpendicular to the signal lines 16 as shown in FIG. 4A and a cell supply line 6b crossing the N$^+$-type diffused region 5 and connected to the N$^+$-type diffused region 5 and the P$^+$-type diffused region 4; and 7 designates a low potential power line that includes a main power line 7a disposed perpendicular to the signal lines 16 as shown in FIG. 4A and a cell supply line 7b crossing the P$^+$-type diffused region 14 and connected to the P$^+$-type diffused region 14 and N$^+$-type diffused region 2. Besides, the main power line 7a is connected to the P-type diffused region 17 so that the high voltage is supplied to an isolation region 32 consisting of the P-type diffused region 17 and the P-type buried diffused region 18.

With such an arrangement, a bipolar transistor structure is formed as shown in FIG. 6A. It is assumed in FIG. 6A that a Vcc potential higher than the GND potential is applied to the high potential power line 6, the GND potential is applied to the low potential power line 7, the Vcc potential is supplied to the N-type substrate 1', and the GND potential is applied to P-type buried diffused region 18. In FIG. 6A, Tr1 designates a first bipolar transistor formed between the N-type well 3 and P-type isolation region 32 with the P$^+$-type diffused region 4 as its emitter; R1 designates a first resistor including the N-type well 3; Tr2 designates a second bipolar transistor formed between the N-type substrate 1' and P-type well 11 with the N$^+$-type diffused region 2 as its emitter; R2 designates a second resistor including the P-type well 11; and R3 designates a third resistor R3 including the N-type substrate 1'.

Figure 6B:
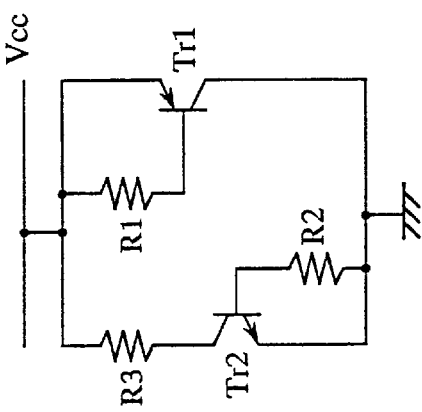
Figure 7:
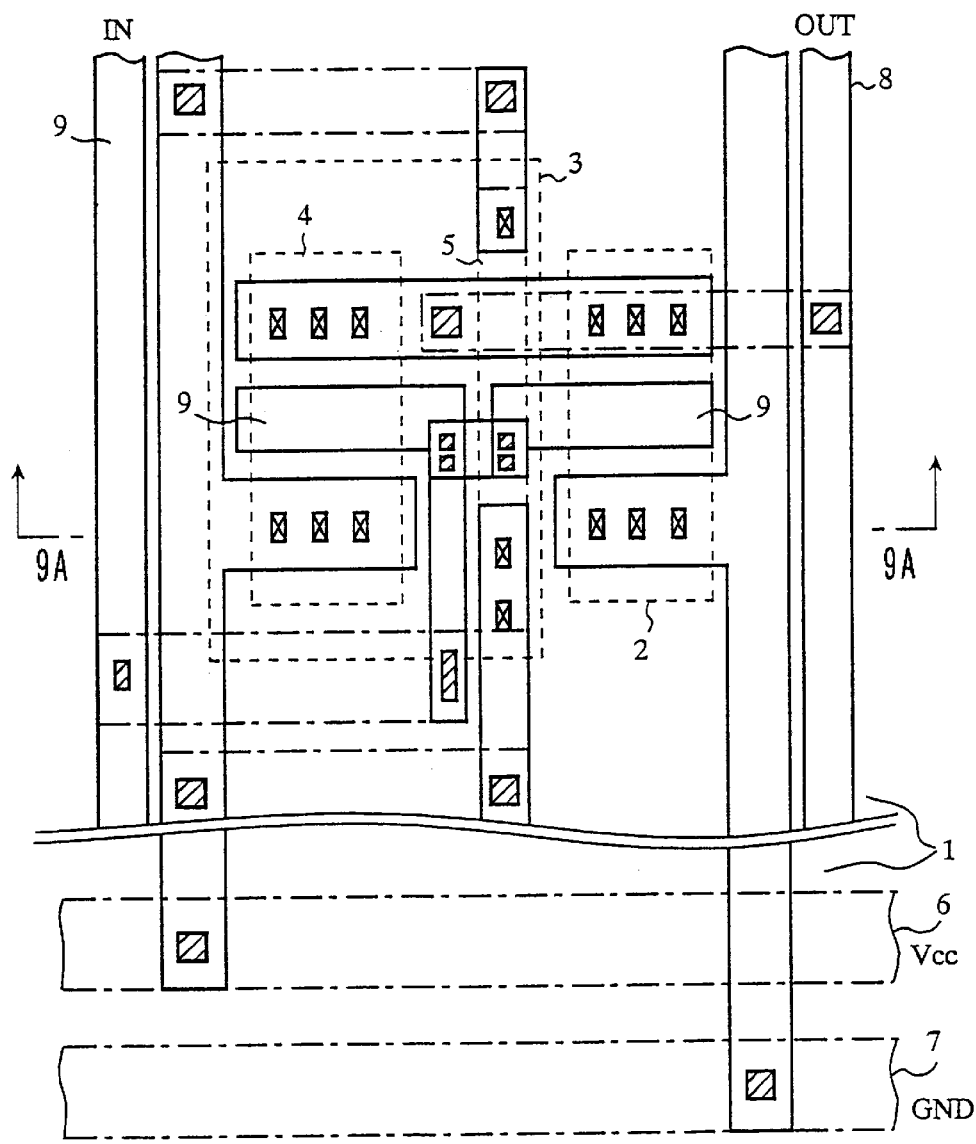
FIG. 7 is a plan view showing a cell of a conventional semiconductor device.
Figure 8:
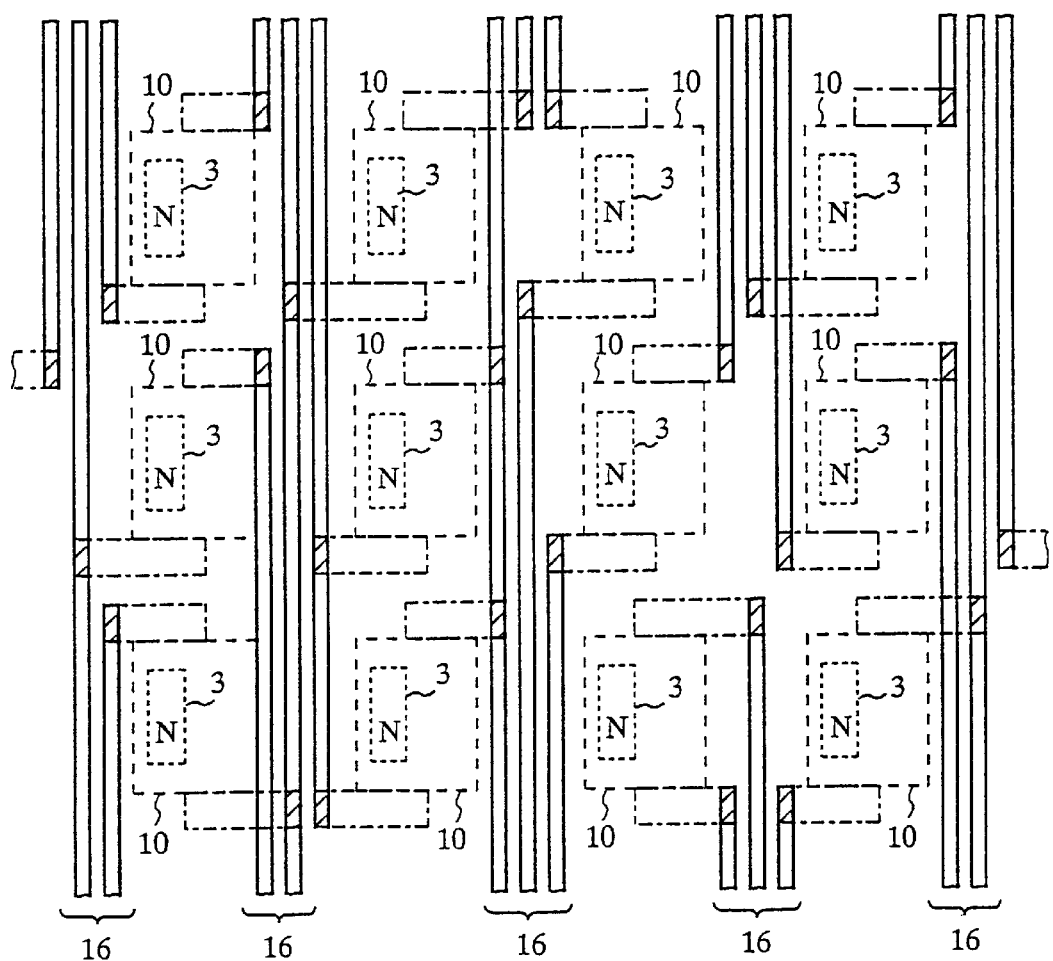
FIG. 8 is a plan view showing a layout of the conventional semiconductor device.
Figure 9A:
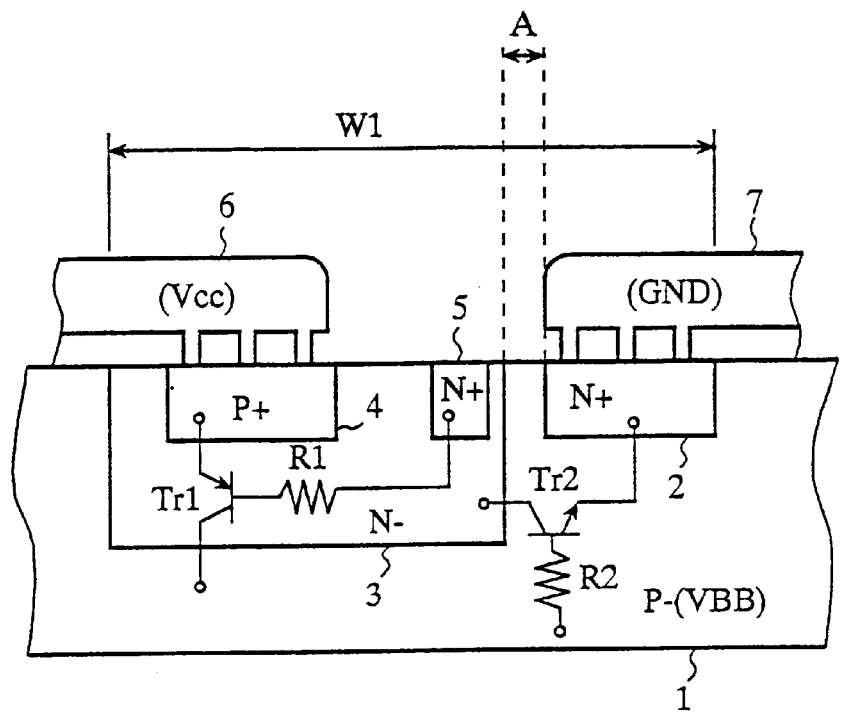
FIGS. 9A and 9B are a cross-sectional view showing the cell and a circuit diagram showing a transistor structure, respectively, of the conventional semiconductor device.
Figure 9B:
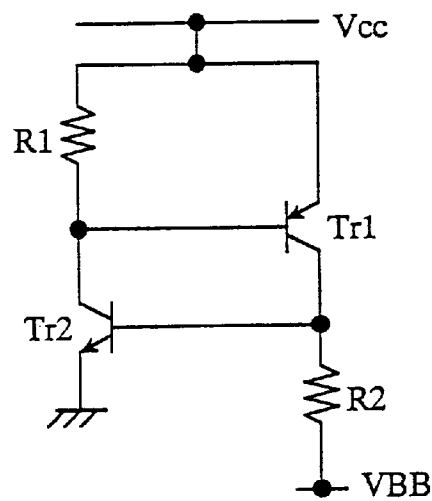
Figure 10:
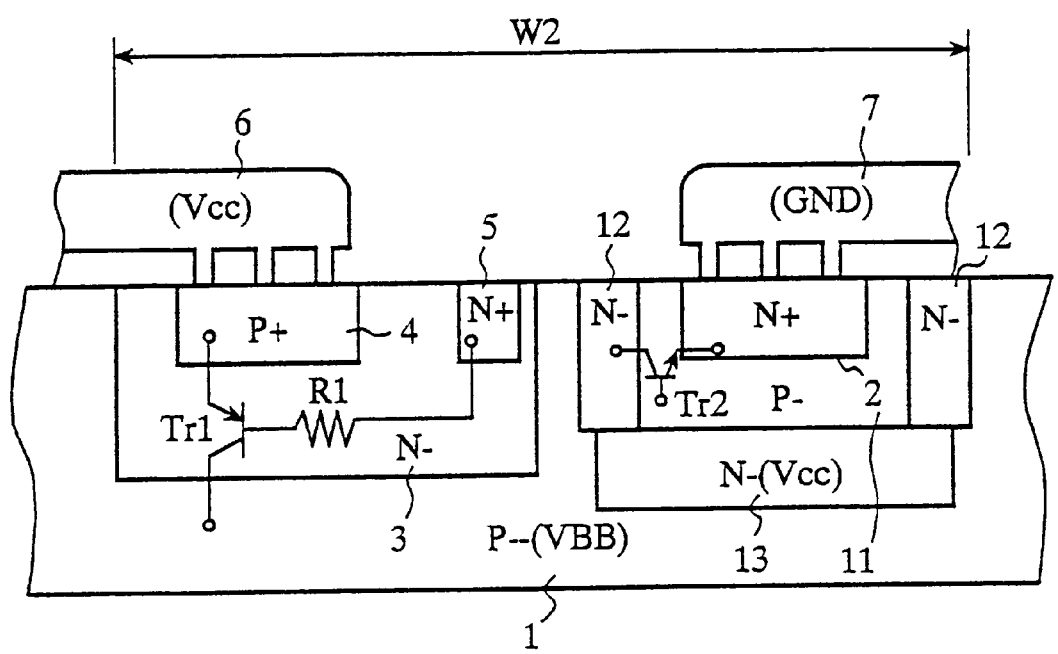
FIG. 10 is a cross-sectional view showing a cell of another conventional semiconductor device.

FIG. 6B is a circuit diagram illustrating an equivalent circuit of the bipolar transistor structure as shown in FIG. 6A. As shown in FIG. 6B, since the bipolar transistor structure of each cell 10 of the present embodiment 2 has the collector of the second bipolar transistor Tr2 disconnected from the base of the first bipolar transistor Tr1, and the base of the second bipolar transistor disconnected from the collector of the first bipolar transistor Tr1, no thyristor structure is formed. Thus, the latchup problem is completely solved.

When a signal at the GND level is input through the input signal line 9, for example, the N$^+$-type diffused region 2 is controlled to be in a cutoff state, whereas the P$^+$-type diffused region 4 is controlled to be in a linear operating state. As a result, a signal at the Vcc level is produced from the output signal line 8.

In contrast, when a signal at the Vcc level is input through the input signal line 9, the P$^+$-type diffused region 4 is controlled to be in the cutoff state, whereas the N$^+$-type diffused region 2 is controlled to be in the linear operating state. As a result, a signal at the GND level is produced from the output signal line 8.

Accordingly, the foregoing cell 10 operates as an inverter. Combining the multiple cells 10 makes it possible to implement various types of logic circuits.

Thus, the present embodiment 2 can prevent the thyristor structure from occurring because the first bipolar transistor Tr1 in the N-type well 3 can be isolated from the second bipolar transistor Tr2 in the P-type well 11, thanks to the following structure. First, any two cells 10, which are adjacent in the direction of alignment of the P-type wells 11 and the N-type wells 3, are disposed so that either two N-type wells 3 or two P-type wells 11 are disposed successively in the two adjacent cells 10. Second, the isolation region 32 consisting of the P-type diffused region 17 and the P-type buried diffused region 18 extends across two adjacent cells so that two N-type wells 3 are isolated from the N-type substrate 1' so that the two successive N-type wells in two adjacent cells are isolated collectively from the N-type substrate 1'.

As a result, even when the semiconductor device having a DRAM and a logic circuit on the same substrate generates within it a voltage which is higher than the high voltage of the power supply supplied to its N-type substrate, in spite of its small current capacity, the device prevents a large current from flowing into the logic circuit from the N-type substrate. This avoids latchup. In other words, the cells for the logic circuit with the foregoing structure prevent latchup even in a semiconductor device in which a DRAM and a logic circuit are present together and the potential of the N-type substrate is set equal to or higher than the high potential.

In addition, since the isolation region includes every other pair of adjacent cells in the present structure, the increase in the total cell width due to the isolation region is repressed. This enables a high degree of integration while avoiding latchup.

What is claim is:

1. A semiconductor device comprising:
   a P-type substrate set at a potential lower than a around potential of a power supply connected to said semiconductor device; and
   at least two cells, each of said cells including:
     an N-type well in said substrate;
     a P-type well in said substrate;
     a P-type diffused region in said N-type well;
     an N-type diffused region in said P-type well; and
     an isolation region in said substrate isolating the one of said N-type and P-type wells having the same conductivity type as said substrate, from said substrate,
   wherein any two cells which are adjacent in a direction of alignment intersecting both N-type wells and P-type wells are disposed such that two wells of the same conductivity type are disposed successively in two adjacent cells, and
   wherein said isolation region extends across two adjacent cells and encloses two successive wells of the same conductivity type, collectively isolating said two successive wells from said substrate, said two successive wells having the same conductivity type as said substrate.

2. A semiconductor device comprising:
   an N-type substrate at a potential no lower than a high potential of a power supply connected to said semiconductor device; and
   at least two cells, each of said cells including:
     an N-type well in said substrate;
     a P-type well in said substrate;
     a P-type diffused region in said N-type well;
     an N-type diffused region in said P-type well; and
     an isolation region in said substrate isolating the one of said N-type and P-type wells having the same conductivity type as said substrate, from said substrate,
   wherein any two cells which are adjacent in a direction of alignment intersecting both N-type wells and P-type wells are disposed such that two wells of the same conductivity type are disposed successively in two adjacent cells, and
   wherein said isolation region extends across two adjacent cells and encloses two successive wells of the same conductivity type, collectively isolating said two successive wells from said substrate, said two successive wells having the same conductivity type as said substrate.

3. A semiconductor device comprising:
   a doped substrate having a conductivity type, and a potential lower than a ground potential of a power supply connected to said semiconductor substrate; and
   a plurality of memory cells and logic cells, each of said logic cells including:
     an N-type well in said substrate;
     a P-type well in said substrate;
     a P-type diffused region in said N-type well;
     an N-type diffused region in said P-type well; and
     an isolation region isolating the one of said N-type and P-type wells having the same conductivity type as said substrate, from said substrate,
   wherein any two logic cells which are adjacent in a direction of alignment intersecting both N-type wells and P-type wells are disposed such that two wells of the same conductivity type are disposed successively in two adjacent logic cells, and
   wherein said isolation region extends across two adjacent logic cells and encloses two successive wells of the same conductivity type, collectively isolating said two successive wells from said substrate, said two successive wells having the same conductivity type as said substrate.

4. A semiconductor device comprising:
   a doped substrate having a conductivity type, and a potential no lower than a high potential of a power supply connected to said semiconductor device; and
   a plurality of memory cells and logic cells, each of said logic cells including:
     an N-tyle well in said substrate;
     a P-type well in said substrate;
     a P-tyte diffused region in said N-type well;
     an N-type diffused region in said P-type well; and
     an isolation region isolating the one of said N-type and P-type wells having the same conductivity type as said substrate, from said substrate,
   wherein any two logic cells which are adjacent in a direction of alignment intersecting both N-type wells and P-type wells are disposed such that two wells of the same conductivity type are disposed successively in two adjacent logic cells, and
   wherein said isolation region extends across two adjacent logic cells and encloses two successive wells of the same conductivity type, collectively isolating said two successive wells from said substrate, said two successive wells having the same conductivity type as said substrate.

* * * * *